(12) United States Patent
Margulis

(10) Patent No.: US 11,282,971 B2
(45) Date of Patent: Mar. 22, 2022

(54) HIGH-GAIN STABLE AVALANCHE PHOTO-DIODE FORMED WITHIN A FIRST SEMICONDUCTOR EPITAXIAL LAYER OF A HIGHLY THERMALLY CONDUCTIVE AND ELECTRICALLY INSULATING SUBSTRATE

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 263 days.

(21) Appl. No.: 16/785,996

(22) Filed: Feb. 10, 2020

(65) Prior Publication Data
US 2021/0249543 A1   Aug. 12, 2021

(51) Int. Cl.
| | |
|---|---|
| *H01L 31/024* | (2014.01) |
| *H03K 3/011* | (2006.01) |
| *H01L 23/373* | (2006.01) |
| *H01L 31/107* | (2006.01) |

(52) U.S. Cl.
CPC ........ *H01L 31/024* (2013.01); *H01L 23/3732* (2013.01); *H01L 31/107* (2013.01); *H03K 3/011* (2013.01)

(58) Field of Classification Search
CPC . H01L 31/024; H01L 23/3738; H01L 31/107; H03K 3/011
USPC .......................................... 250/214 R, 214.1
See application file for complete search history.

(56) References Cited

U.S. PATENT DOCUMENTS

| | | | |
|---|---|---|---|
| 8,921,754 B2 * | 12/2014 | Frach | ...................... G01T 1/248 250/214 AG |
| 9,269,835 B2 | 2/2016 | Margulis | |
| 9,869,582 B2 | 1/2018 | Margulis | |

* cited by examiner

*Primary Examiner* — Que Tan Le
(74) *Attorney, Agent, or Firm* — Kilpatrick Townsend & Stockton LLP

(57) ABSTRACT

A method for controlling an avalanche photo diode (APD) and a device that includes a high gain stable APD. The device may include an APD, a compensation circuit that comprises a compensation component that is thermally coupled to the APD, a temperature control module having a part that is thermally coupled to the compensation component and to the APD, and one or more additional components. The APD is formed within a first semiconductor epitaxial layer that is grown on a first side of a substrate, the substrate is highly thermally conductive and electrically insulating.

18 Claims, 8 Drawing Sheets

HIGH-GAIN STABLE AVALANCHE PHOTO-DIODE FORMED WITHIN A FIRST SEMICONDUCTOR EPITAXIAL LAYER OF A HIGHLY THERMALLY CONDUCTIVE AND ELECTRICALLY INSULATING SUBSTRATE

BACKGROUND

Avalanche photo-diode (APD) is a solid-state photo-sensor with internal gain.

U.S. Pat. Nos. 9,269,835 and 9,869,582 (both assigned to Applied Materials Inc.) illustrate state of the art of APD-based systems.

When light signal is applied to APD, it generates current (I) that equals a product of a multiplication of the power (P) of light that impinges on the APD, the photo-sensitivity (S) of the APD and the gain (M) of the APD. The Gain (M) is also referred to as an internal gain of the APD.

The power (P) may be measured in Watts (W), the photo-sensitivity (S) may be measured in Ampere per Watts (A/W) and the gain (M) may be measured in Ampere per Ampere (A/A).

The Value of the gain depends on a value of a voltage applied to the APD (hereinafter APD voltage or VAPD) and the APD junction temperature. This dependence is especially strong for high values of the gain. For simplicity of explanation it is assumed that the APD temperature is the temperature of the APD junction on which light impinges. The APD junction temperature is referred to as APD temperature. It is known in the art that the ability to use an APD in high gain applications (especially at high APD currents) directly depends on the stability of the APD voltage and voltage noise as well as on the stability of the APD temperature. For example, highly sensitive optical systems may aim for using APD at a gain of 500 and at APD current (IAPD) of 300 micro Ampere. Under such requirements, APD junction temperature variation of about 0.05 Celsius may cause an APD current variation (which, for some application, represent an error) of $1/256=0.004=0.4\%$. A 0.4% error is high enough in order to interfere the correct work of highly sensitive optical systems. Known APD-based systems support APD temperature variations of about 1.0 Celsius, which increases error level above and beyond the requirements of certain highly sensitive optical systems.

It is noted that APD temperature is influenced by the APD average current (static current) and by fast APD current changes (dynamic current). Furthermore, in order to prevent APD damage the level of the average APD current should be limited. For example, the average APD current may be limited to a level of few tens of micro-Amperes till few hundreds micro-Amperes (for example, 500 micro Ampere and even few milli Ampere). An APD current dynamic range in practice may be five decades, i.e. 100,000, or even more, and APD current's frequency range may be in the range of few tens of GHz.

The electrical power dissipated on an APD (P) equals IAPD*VAPD. This electrical power is directly converted to heat. If the APD is maintained at a fixed gain then the value of the APD voltage is constant. Therefore, heat dissipated on the APD may change, for example in the range of 100,000 times.

It has been found that the APD temperature changes over time and this induces changes in the gain of the APD. Thus, static or/and dynamic non-linearity of APD response are experienced and this is undesired for certain applications.

Typically, The APD voltage may be set to values between 0V and 500V, depending on required APD gain (the higher limit may be between 5V and few thousand of volts 3,000V for different technologies of APD). Together with wide APD current dynamic range (static and dynamic) it sets significant challenge to designer of bias voltage supply system.

The APD gain may be between 1 A/A and few thousands A/A. For APD gain in the range of few hundreds and for an allowed error of not more than $1/256=0.4\%$, the required stability of the APD voltage is in range of few tens of mV peak-to-peak (voltage domain) and the required stability of the APD temperature is in range of few tens of milli-degrees (temperature domain). For gains of one thousand and more above requirements are even tighter.

There is a growing need to provide a device that facilitates the APD at high gain values at high APD currents.

SUMMARY

There may be provided a device that may include an APD (especially a high-gain stable APD), and a method for controlling an avalanche photo-diode (APD).

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
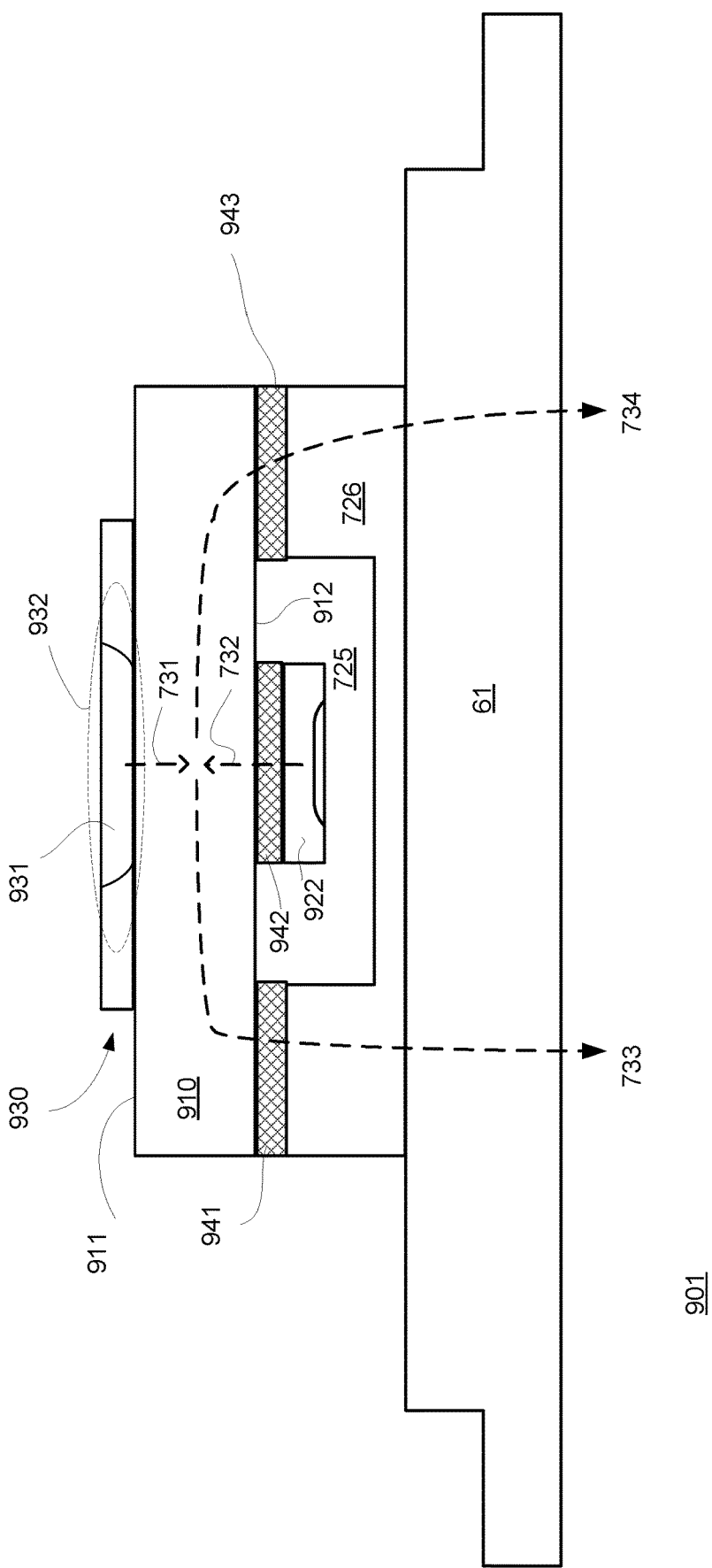
FIG. 1 illustrates an example of an APD and its surroundings.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system. Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium. The term "and/or" means additionally or alternatively.

There is provided a device that may include (a) an avalanche photo-diode (APD), (b) a DC voltage regulator that includes a regulating transistor, arranged to maintain a regulated voltage at a fixed value over different APD currents, (c) a temperature control module that is arranged to maintain a portion of the temperature control module at a fixed temperature, (d) a compensation circuit that includes a compensation component that is thermally coupled to the APD.

A sum of (i) a power dissipated by the APD and (ii) a power dissipated by the compensation component is fixed.

The APD is formed within a first semiconductor epitaxial layer that is grown on a first side of a substrate. The substrate is highly thermally conductive and electrically insulating.

The portion of the temperature control module is thermally coupled to the compensation component and to the APD.

The compensation component (such as a compensation transistor) is configured to compensate for changes in a power dissipated by the APD.

It has been found that is beneficial to increase the thermal conductivity between the APD and the compensation component. The increment of the thermal conductivity may include at least one out of (a) increasing the thermal conductivity between the APD and the substrate, (b) increasing the thermal conductivity between the compensation component and the substrate and (c) increasing the thermal conductivity of the substrate.

The increment may include thinning the APD, the substrate and the compensation component. The thinning may be limited by mechanical limitation—especially when the APD, the substrate and the compensation component are discrete components that are connected to each other by conducting paths formed by soldering the APD and the compensating transistor to the substrate). This required the substrate to provide mechanical support to different components connected to the substrate.

According to an embodiment, the APD may be formed within a first semiconductor epitaxial layer that is grown on a first side of a substrate. This substantially increases the thermal conductivity between the APD and the substrate and also allow the substrate and the APD to be thin.

The first semiconductor epitaxial layer may be thick enough only to enable the making of the APD within.

The thickness of the first semiconductor epitaxial layer may range between 15 and 50 microns.

The compensation component may also be a part of a semiconductor epitaxial layer grown on the substrate.

The compensation component may be included in the first semiconductor epitaxial layer.

The compensation component may be included in a second semiconductor epitaxial layer.

The second semiconductor epitaxial layer may be grown on a second side of the substrate that may be opposite to the first side of the substrate.

The making of the APD and the compensation component on the substrate also improves the mechanical connection of the APD and the compensation component to the substrate and reduces the amount of mechanical support that should be provided by the substrate—and allows for thinning the substrate.

FIG. 1 is an example of a part 901 of a device.

Part 901 includes (a) base 61, (b) low thermally conductive insulator 726, (c) first semiconductor epitaxial layer 930, (d) APD 932 that includes APD junction 931, APD 932 is included in first semiconductor epitaxial layer 930, (e) a substrate such as a diamond substrate 910 that is highly thermally conductive and electrically insulating, the first semiconductor epitaxial layer 930 is grown on a first side 911 of diamond substrate 910, (f) compensation components such as compensation component 922 that is thermally coupled to substrate 910, and (g) an intermediate layer (the intermediate layer may be metallic, may include a soldering material, and the like) that includes first intermediate elements 941, second intermediate element 942 and third intermediate element 943.

Each one of first intermediate element 941 and second intermediate element 942 is located between a second side 912 of the diamond substrate 910 and low thermally conductive insulator 726.

Third intermediate element 943 is located between a second side 912 of the diamond substrate 910 and low thermally conductive insulator 726.

The compensation component 922 is installed within a cavity 725. Cavity 725 is delimited by, at least, base 61 and low thermally conductive insulator 726.

A sum of (a) a power dissipated by the APD and (b) a power dissipated by the compensation component is fixed.

FIG. 1 also illustrates:

a. Compensation component heat flux 732 that is generated by the compensation component and flows towards the diamond substrate 910.
b. APD heat flux 731 that is generated by the APD 932 and flows towards the diamond substrate 910.

Right heat flux 734 and left heat flux 733 that propagate through the diamond substrate 910, first and third intermediate elements, the low thermally conductive insulator 726 from the right and the left to the cavity 725, and propagate through base 61 towards an intermediate plate (not shown).

Figure 2:
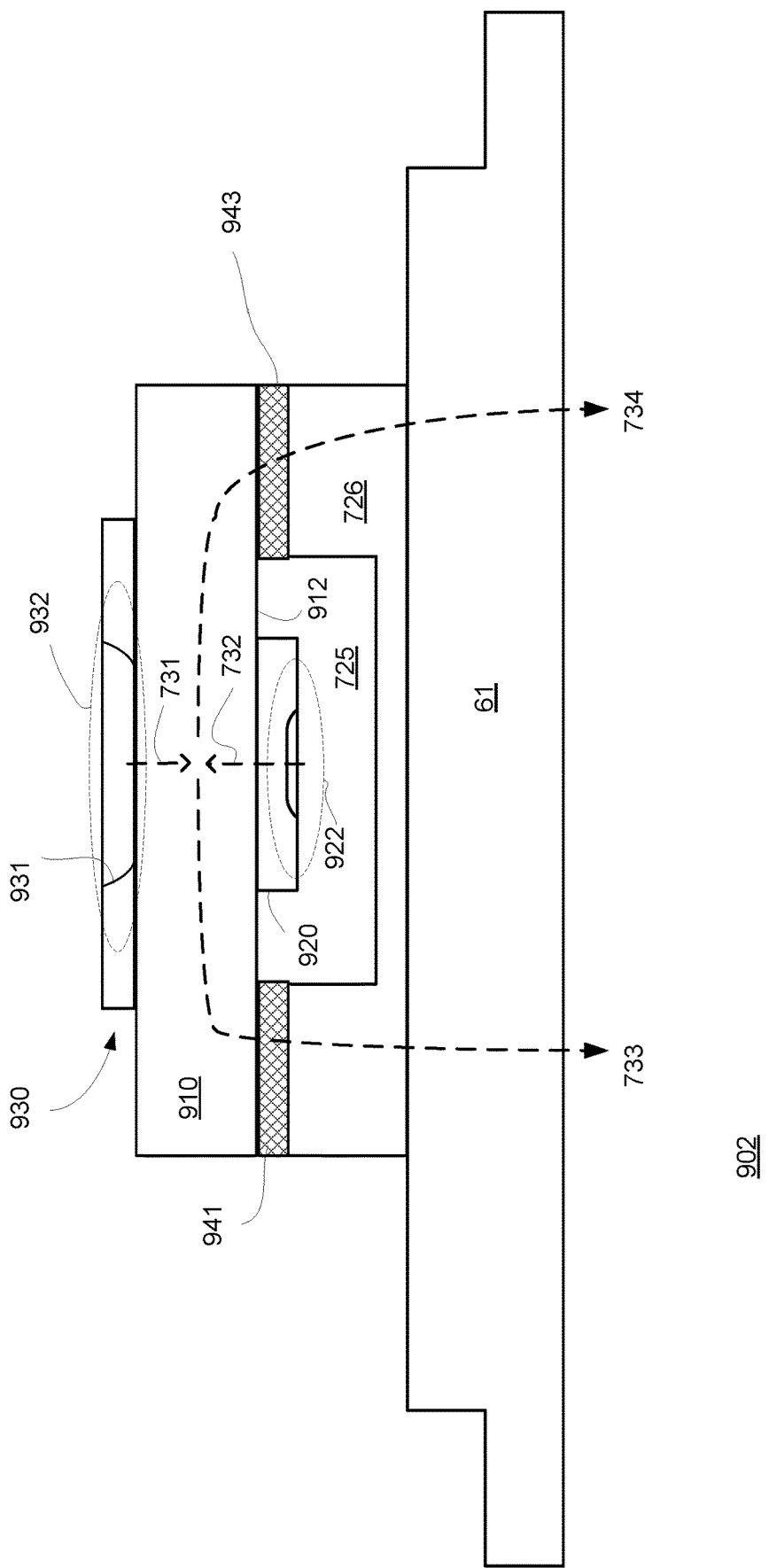
FIG. 2 illustrates an example of an APD and its surroundings.

FIG. 2 is an example of a part 902 of a device.

Part 902 differs from part 901 by having the compensation component 922 included in a second semiconductor epitaxial layer 920 that is grown on second side 912 of the diamond substrate 910.

FIG. 2 also illustrates:
a. Compensation component heat flux 732 that is generated by the compensation component and flows towards the diamond substrate 910.
b. APD heat flux 731 that is generated by the APD 932 and flows towards the diamond substrate 910.
c. Right heat flux 734 and left heat flux 733 that propagate through the diamond substrate 910, first and third intermediate elements, the low thermally conductive insulator 726 from the right and the left to the cavity 725, and propagate through base 61 towards an intermediate plate (not shown).

Figure 3:
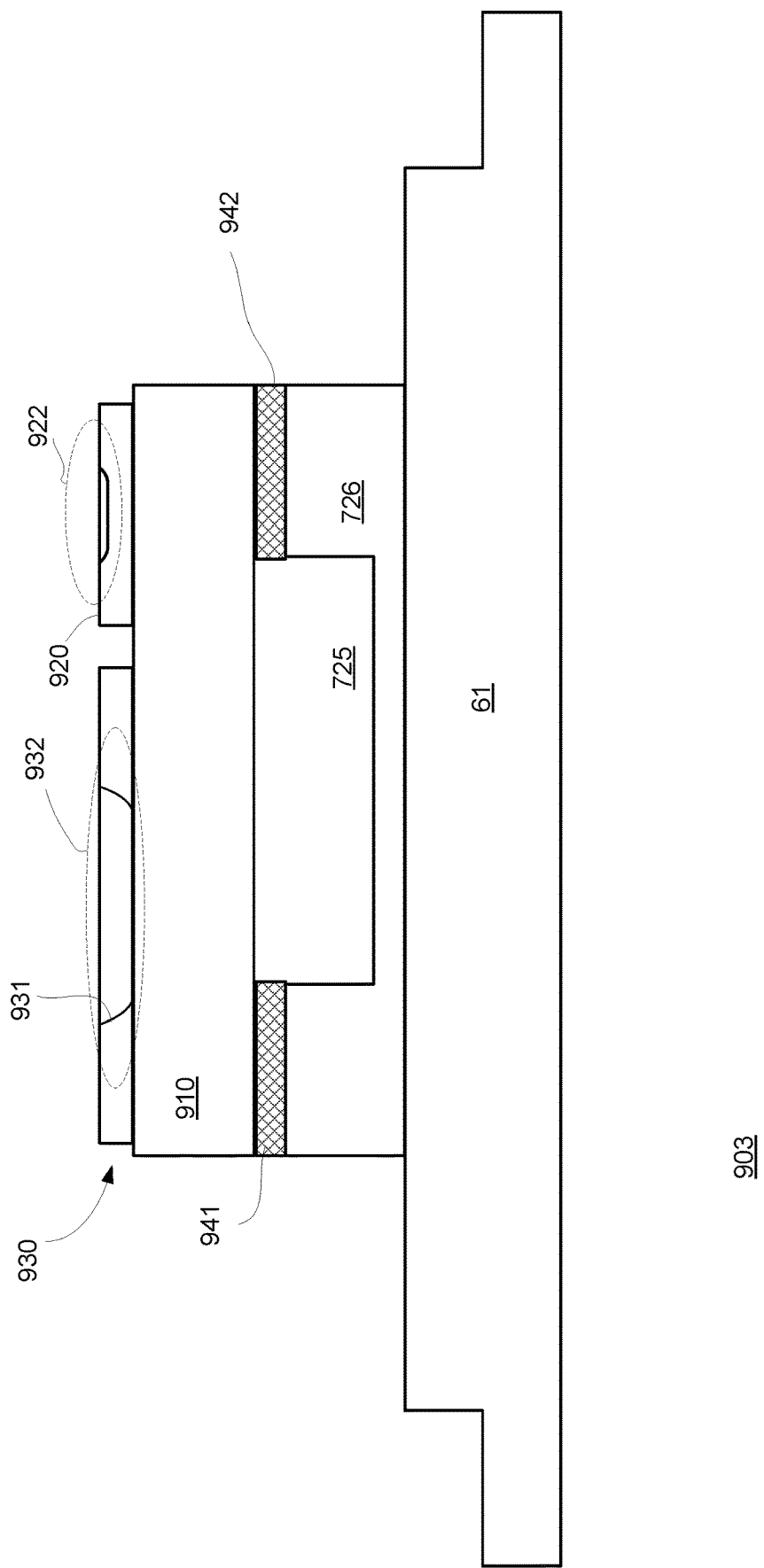
FIG. 3 illustrates an example of an APD and its surroundings.

FIG. 3 is an example of a part 903 of a device.

Part 903 differs from part 901 by having the compensation component 922 included in the first semiconductor epitaxial layer 930.

It should be noted that the compensation component 922 and the APD 932 may be included within the same semiconductor epitaxial layer.

Figure 4:
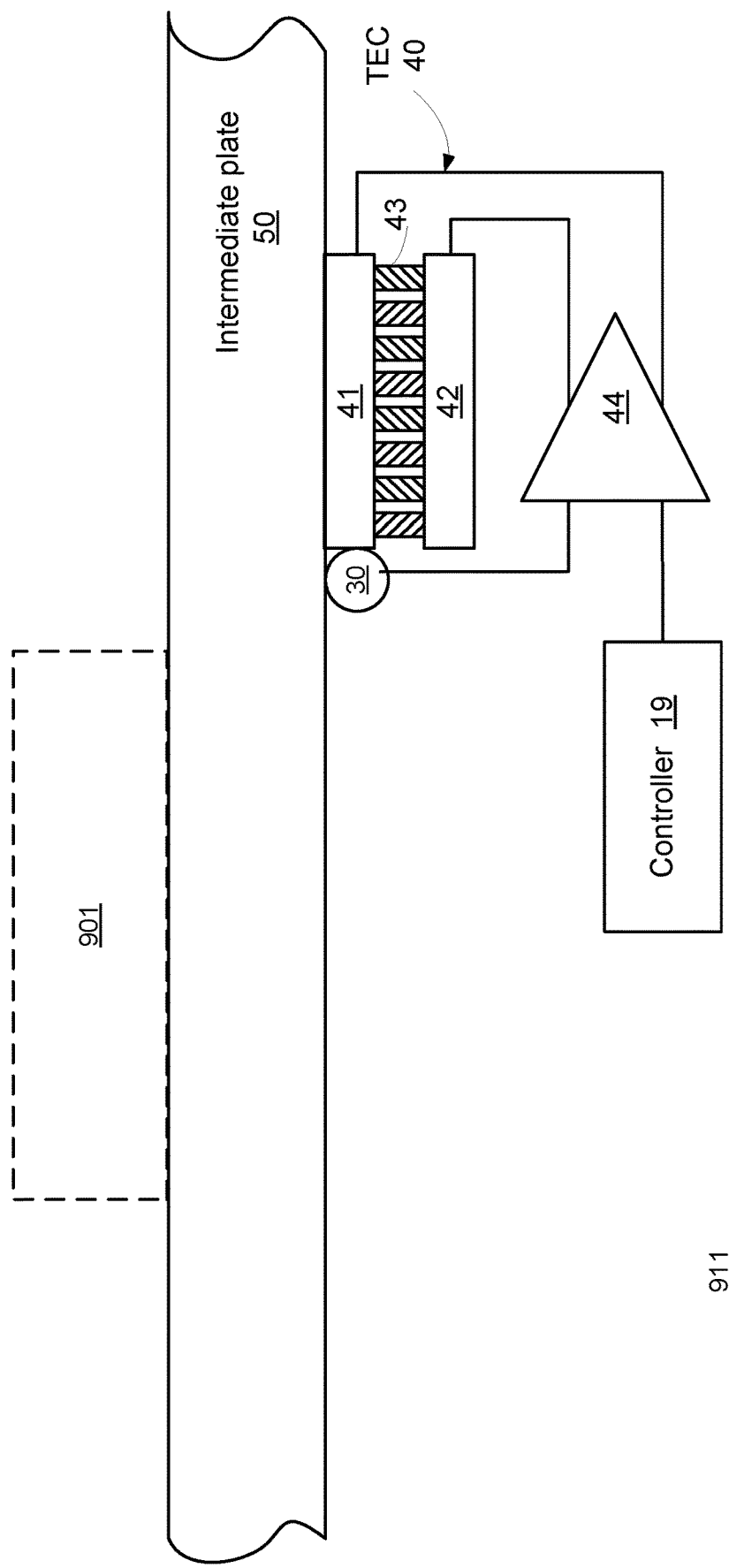
FIG. 4 illustrates an example of an APD and its surroundings.
Figure 5:
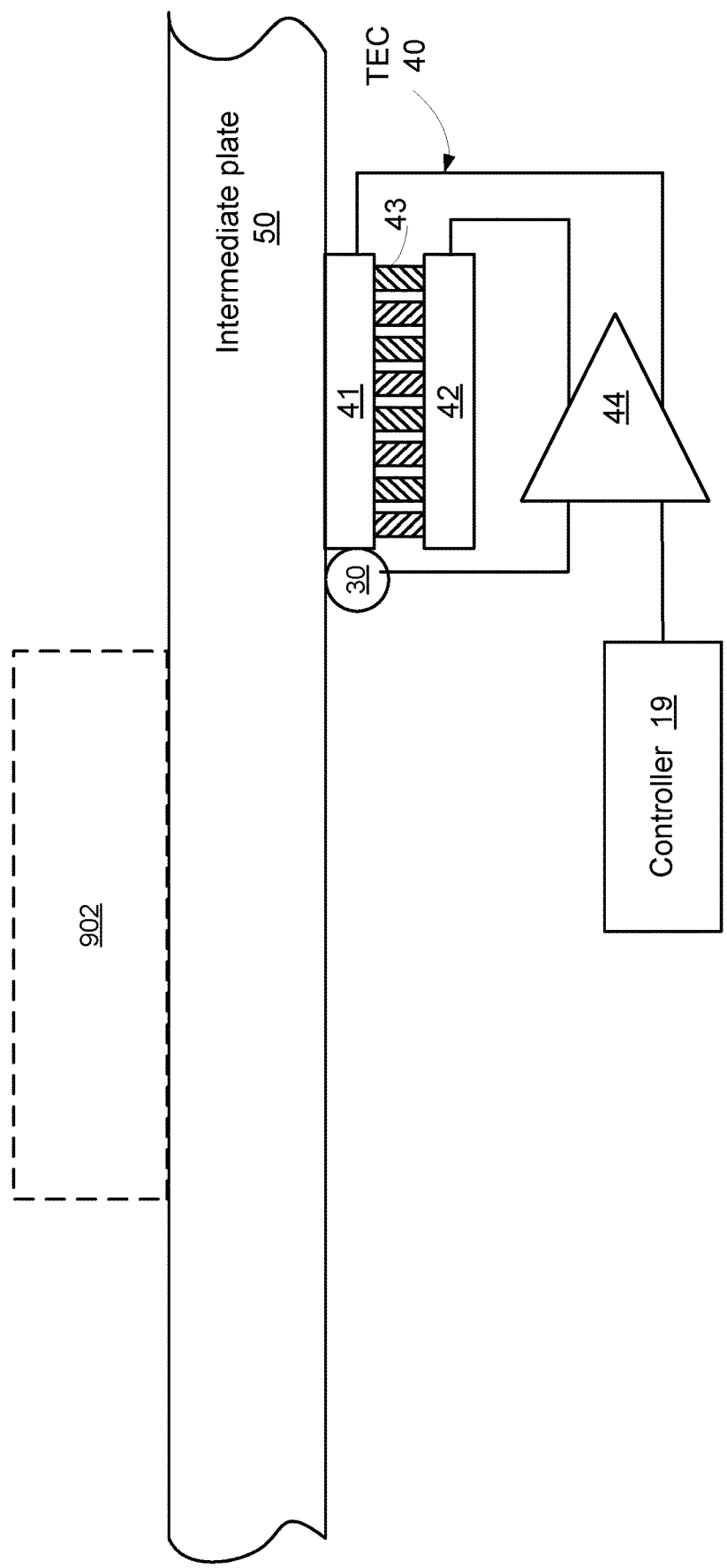
FIG. 5 illustrates an example of an APD and its surroundings.
Figure 6:
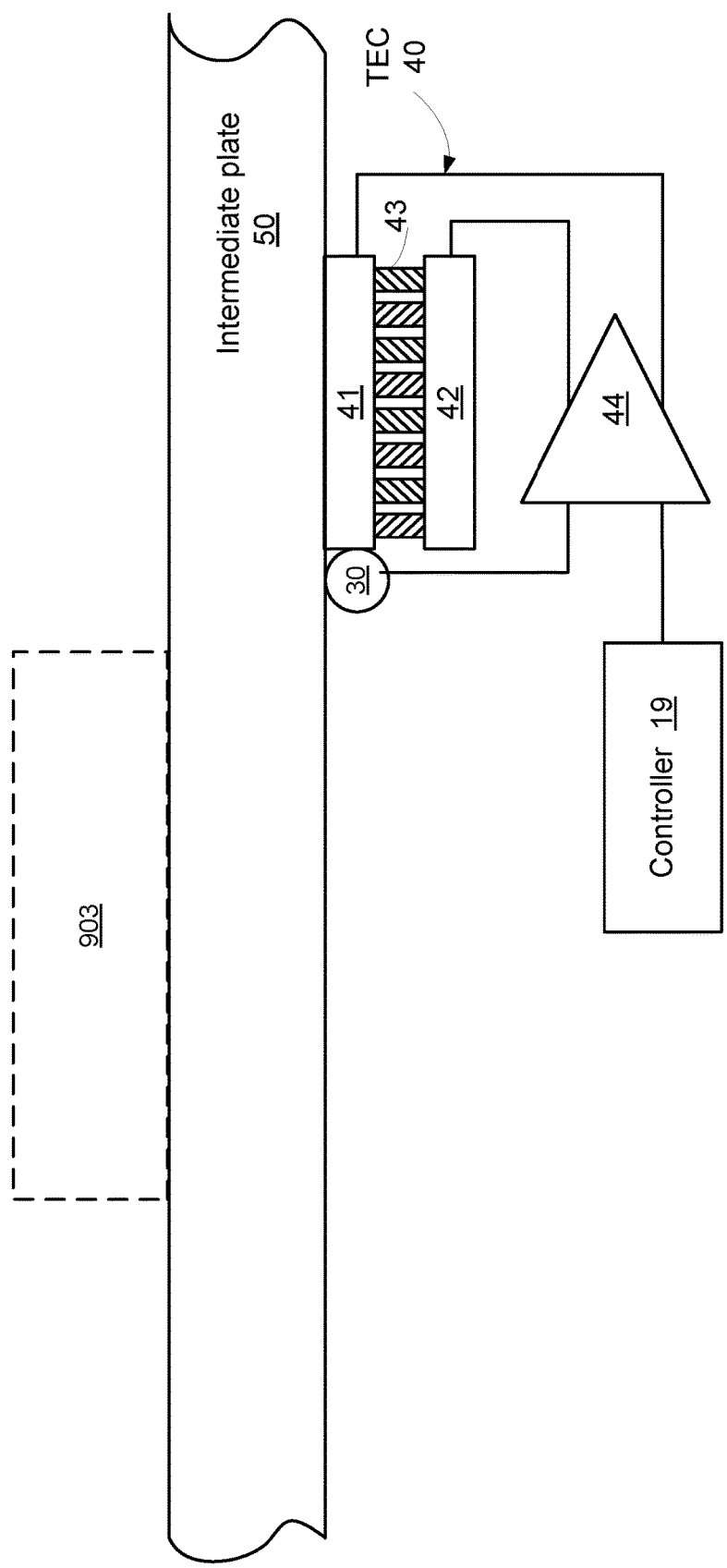
FIG. 6 illustrates an example of an APD and its surroundings.

FIGS. 4, 5 and 6 are examples of part 901, part 902 and part 903 respectively and of additional elements such as intermediate plate 50, controller 19, thermoelectric cooler (TEC) controller 44, temperature sensor 30 and TEC 40. TEC 40 includes cold plate 41, hot plate 42, and solid state devices 43. Solid state devices 43 transfer heat from cold plate 41 to hot plate 42 under the control of electrical current, generated through it by TEC controller 44.

Intermediate plate 50 thermally couples TEC 40 to base 61.

TEC controller 44 receives temperature readings (about the temperature of cold plate 41 or other part of TEC 40) from temperature sensor 30. TEC controller 44 also receives (from controller 19) a request to set TEC to a desired temperature.

TEC controller 44, controls the temperature applied by TEC 40 in order to set the intermediate plate 50 to a desired temperature—thereby determine the temperature of the APD 932 and the compensation component 922, combined together as a single thermal component.

Figure 7:
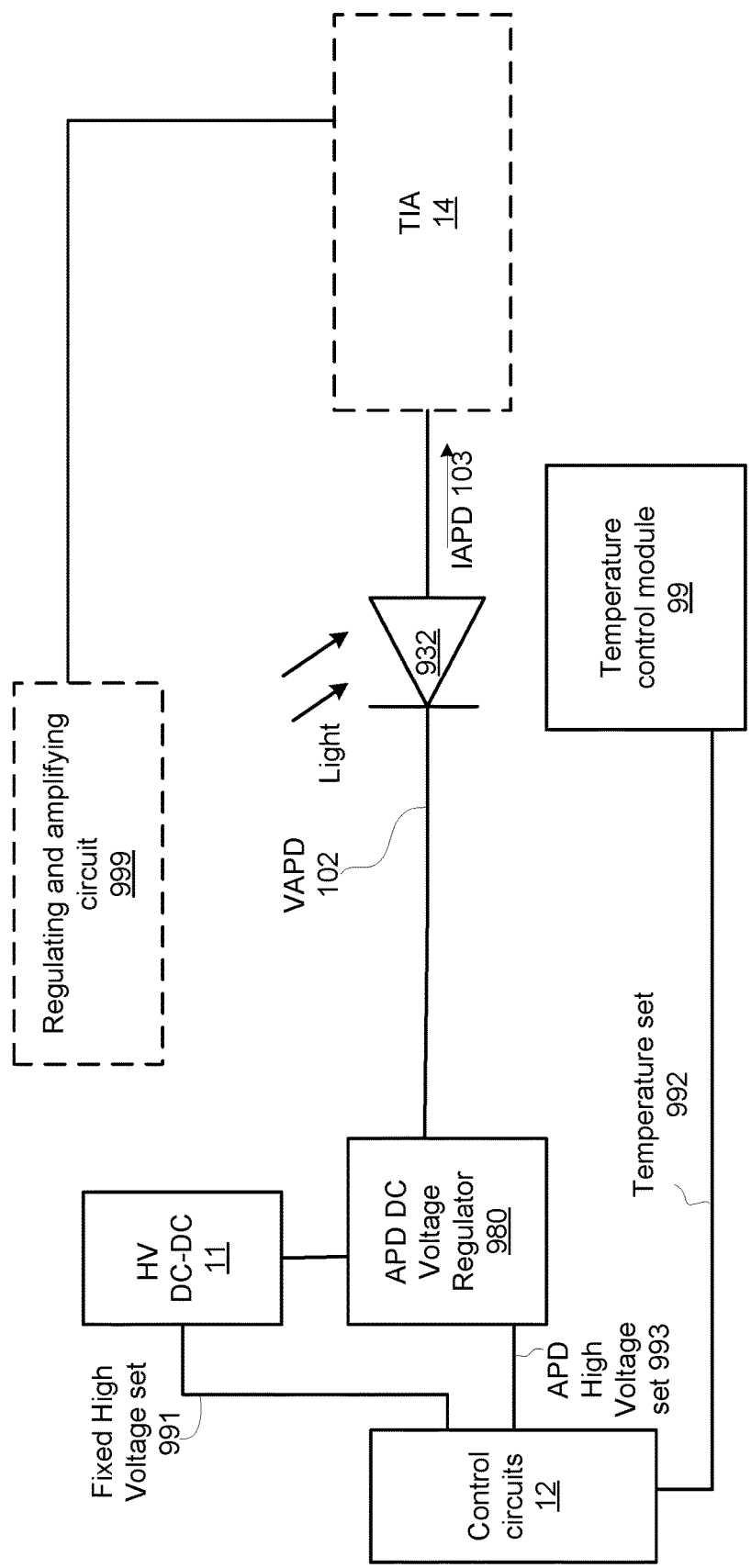
FIG. 7 illustrates an example of a device that includes an APD and its surroundings.

FIG. 7 illustrates an example of device 970. Device 970 includes APD 932, high voltage DC to DC converter ("HV DC-DC") 11, temperature control module 99 (may include the TEC controller, the TEC and a temperature sensor), transimpedance amplifier (TIA 14), control circuits 12, APD DC voltage regulator 980 (may include first capacitor, current source, second capacitor and DC High Voltage Shunt Regulator), and regulating and amplifying circuit 999.

The control circuits 12 may (a) output to APD DC voltage regulator an APD high voltage set signal 993 for setting the value of the APD voltage (VAPD) 102, (b) output a temperature set signal 992 to the temperature control module 99 for setting the desired temperature of at least part of the temperature control module 99, and (c) output a fixed high voltage set signal 991 for adjusting the value of HV DC-DC 11 output voltage. The current outputted by APD 932 is denoted IAPD 103.

The control circuits 12 are coupled to HV DC-DC 11, to APD DC voltage regulator 980, and to the temperature control module 99. TIA 14 is coupled between APD 932 and regulating and amplifying circuit 999.

A non-limiting example of compensation component is illustrated in U.S. Pat. No. 9,269,835 (especially in FIG. 6 of U.S. Pat. No. 9,269,835). For example—APD high voltage regulator may include first capacitor, current source, second capacitor and DC voltage regulator, comprising amplifier and transistor. In this example, a transistor from DC voltage regulator may be used as a compensation component in order to stabilize the APD temperature.

Another non-limiting example of a compensation component is illustrated in U.S. Pat. No. 9,869,582 (especially in FIG. 13 of U.S. Pat. No. 9,869,582). For example—APD high voltage regulator may include first capacitor, current source, second capacitor and DC voltage regulator, comprising amplifier and transistor. The transistor from DC voltage regulator may be used as a compensation component.

Yet for another example—regulating and amplifying circuits 999 may include a second DC voltage regulator, a second voltage supply, a second current source, a configurable voltage amplifier and a transconductance amplifier. A transistor of a second DC voltage regulator may be used as a compensation component.

Various control schemes and devices that include an APD are illustrated in U.S. Pat. Nos. 9,269,835 and 9,869,582, both are incorporated herein by reference.

Figure 8:
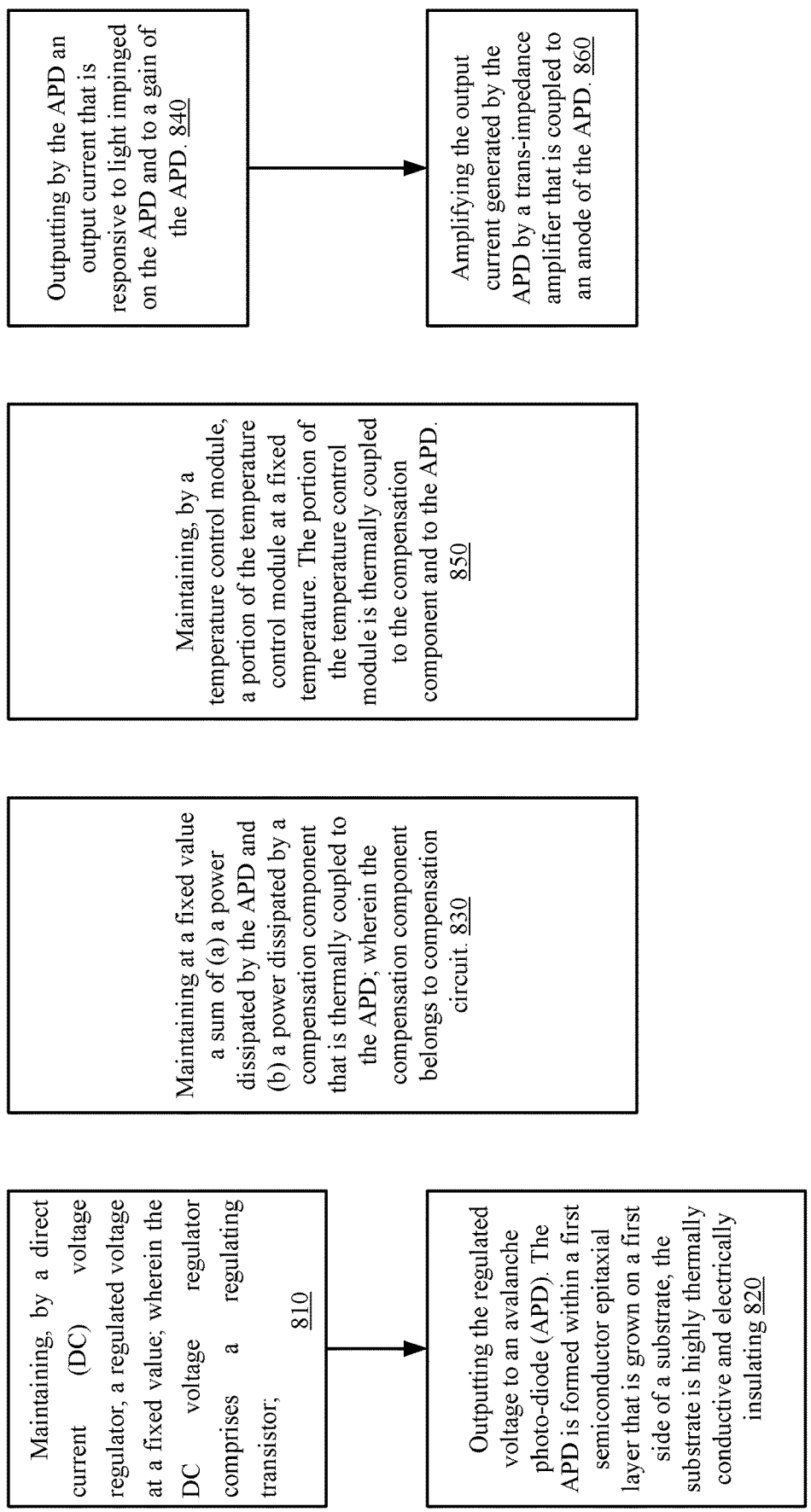
FIG. 8 illustrates an example of a method.

FIG. 8 illustrates an example of method 800.

Method 800 may start by steps 810, 830, 840 and 850.

Step 810 includes maintaining, by a direct current (DC) voltage regulator, a regulated voltage at a fixed value. The DC voltage regulator includes a regulating transistor.

Step 810 may be followed by step 820 of outputting the regulated voltage to an avalanche photo-diode (APD). The APD is formed within a first semiconductor epitaxial layer that is grown on a first side of a substrate, the substrate is highly thermally conductive and electrically insulating.

Step 830 includes maintaining at a fixed value a sum of (a) a power dissipated by the APD and (b) a power dissipated by a compensation component that is thermally coupled to the APD; wherein the compensation component belongs to compensation circuit.

Step 850 may include maintaining, by a temperature control module, a portion of the temperature control module at a fixed temperature. The portion of the temperature control module is thermally coupled to the compensation component and to the APD.

Step 840 may include outputting by the APD an output current that is responsive to light impinged on the APD and to a gain of the APD.

Step 840 may be followed by step 860 of amplifying the output current generated by the APD by a trans-impedance amplifier that is coupled to an anode of the APD and to a regulating and amplifying circuit. An output signal of the trans-impedance amplifier may be regarded as an output signal of a device that includes the APD.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

I claim:

1. A device, comprising:
   an avalanche photo-diode (APD);
   a DC voltage regulator that comprises a regulating transistor, arranged to maintain a regulated voltage at a fixed value over different APD currents;
   a temperature control module that is arranged to maintain a portion of the temperature control module at a fixed temperature;
   a compensation circuit that comprises a compensation component that is thermally coupled to the APD;
   wherein a sum of (a) a power dissipated by the APD and (b) a power dissipated by the compensation component is fixed;
   wherein the portion of the temperature control module is thermally coupled to the compensation component and to the APD; and
   wherein the APD is formed within a first semiconductor epitaxial layer that is grown on a first side of a substrate, the substrate is highly thermally conductive and electrically insulating.

2. The device according to claim 1 wherein the compensation component is formed within a second semiconductor epitaxial layer that is grown on a second side of the substrate, the second side of the substrate and the first side of the substrate are opposite to each other.

3. The device according to claim 2 wherein the first semiconductor epitaxial layer and the second semiconductor epitaxial layer are of a same thickness.

4. The device according to claim 2 wherein the first semiconductor epitaxial layer differs from the second semiconductor epitaxial layer by thickness.

5. The device according to claim 1 wherein the substrate is a diamond substrate.

6. The device according to claim 1 wherein a thickness of the substrate and a thickness of the first semiconductor epitaxial layer ranges between 40 and 100 micron.

7. The device according to claim 1 wherein the compensation component is formed within the first semiconductor epitaxial layer.

8. The device according to claim 1 wherein the compensation component is thermally coupled to the substrate via a metallic layer.

9. The device according to claim 8 wherein the compensation component is positioned within a cavity formed within an insulating element that exhibits a low thermal conductance.

10. A method for controlling an avalanche photo-diode (APD), the method comprises:
    maintaining, by a direct current (DC) voltage regulator, a regulated voltage at a fixed value; wherein the DC voltage regulator comprises a regulating transistor;
    outputting the regulated voltage to the avalanche photo-diode (APD), the APD is coupled to the regulating transistor;
    maintaining, at a fixed value, a sum of (a) a power dissipated by the APD and (b) a power dissipated by a compensation component that is thermally coupled to the APD; wherein the compensation component belongs to compensation circuit; and maintaining, by a temperature control module, a portion of the temperature control module at a fixed temperature; and wherein the portion of the temperature control module is thermally coupled to the compensation component and to the APD;

wherein the APD is formed within a first semiconductor epitaxial layer that is grown on a first side of a substrate, the substrate is highly thermally conductive and electrically insulating.

11. The method according to claim 10, wherein the compensation component is formed within a second semiconductor epitaxial layer that is grown on a second side of the substrate, the second side of the substrate and the first side of the substrate are opposite to each other.

12. The method according to claim 11 wherein the first semiconductor epitaxial layer and the second semiconductor epitaxial layer are of a same thickness.

13. The method according to claim 11 wherein the first semiconductor epitaxial layer differs from the second semiconductor epitaxial layer by thickness.

14. The method according to claim 10 wherein the substrate is a diamond substrate.

15. The method according to claim 10 wherein a thickness of the substrate and a thickness of the first semiconductor epitaxial layer ranges between 40 and 100 micron.

16. The method according to claim 10 wherein the compensation component is formed within the first semiconductor epitaxial layer.

17. The method according to claim 10 wherein the compensation component is thermally coupled to the substrate via a metallic layer.

18. The method according to claim 17 wherein the compensation component is positioned within a cavity formed within an insulating element that exhibits a low thermal conductance.

* * * * *